United States Patent
Miyabe et al.

(10) Patent No.: US 7,753,974 B2
(45) Date of Patent: Jul. 13, 2010

(54) POLISHING COMPOSITION FOR SEMICONDUCTOR WAFER, METHOD FOR PRODUCTION THEREOF AND POLISHING METHOD

(75) Inventors: Shinsuke Miyabe, Tokyo (JP); Kuniaki Maejima, Tokyo (JP); Masahiro Izumi, Tokyo (JP); Hiroaki Tanaka, Kanagawa (JP)

(73) Assignee: Nippon Chemical Industrial Co., Ltd., Tokyo (JP)

( * ) Notice: Subject to any disclaimer, the term of this patent is extended or adjusted under 35 U.S.C. 154(b) by 0 days.

(21) Appl. No.: 12/153,111

(22) Filed: May 14, 2008

(65) Prior Publication Data

US 2008/0287038 A1 Nov. 20, 2008

(30) Foreign Application Priority Data

May 18, 2007 (JP) ............................. 2007-132223

(51) Int. Cl.
- *B24D 3/02* (2006.01)
- *C09C 1/68* (2006.01)
- *C09C 1/02* (2006.01)
- *C09K 3/14* (2006.01)
- *H01L 21/302* (2006.01)

(52) U.S. Cl. ............................. 51/308; 51/307; 51/309; 106/3; 438/691; 438/692; 438/693; 438/694

(58) Field of Classification Search ........... 51/307–309; 106/3; 438/691–694

See application file for complete search history.

(56) References Cited

U.S. PATENT DOCUMENTS

| 5,767,016 A * | 6/1998 | Muroyama ................. 438/693 |
| 6,299,659 B1 * | 10/2001 | Kido et al. ................... 51/309 |
| 6,844,263 B2 * | 1/2005 | Shimazu et al. ............. 438/692 |

FOREIGN PATENT DOCUMENTS

| JP | 08-045934 | 2/1996 |
| JP | 08-083780 | 3/1996 |
| JP | 2001-332518 | 11/2001 |
| JP | 2003-243340 | 8/2003 |
| JP | 2006-196508 | 7/2006 |
| WO | WO-89/12082 | 12/1989 |

\* cited by examiner

*Primary Examiner*—Anthony J Green
*Assistant Examiner*—Pegah Parvini
(74) *Attorney, Agent, or Firm*—Edwards Angell Palmer & Dodge LLP

(57) ABSTRACT

The present invention relates to a polishing composition for a substrate including a metal such as wiring, etc., formed on a semiconductor wafer, which can provide a high polishing rate without causing scratches on the wiring metal, a method of producing the polishing composition, and a polishing method. The polishing composition for a semiconductor wafer comprises an acid and an aqueous medium dispersion containing positively-charged silica particles having an amino group-containing silane coupling agent bonded on a surface thereof, the polishing composition having a pH of 2 to 6.

7 Claims, No Drawings

POLISHING COMPOSITION FOR SEMICONDUCTOR WAFER, METHOD FOR PRODUCTION THEREOF AND POLISHING METHOD

FIELD OF THE INVENTION

The present invention relates to a polishing composition for surfaces and edge of semiconductor wafers having a metal film, and to a method of producing the polishing composition. The present invention also relates to a polishing method for semiconductor wafers by using the polishing composition.

BACKGROUND OF THE INVENTION

Electronic components such as ICs, LSIs and super LSIs using semiconductor materials such as single crystal silicon as raw material, are produced as follows: a single crystal ingot of silicon or the other compound semiconductors is sliced into thin disc wafers; a number of fine electronic circuits are built in the wafer; and then the wafer is broken up into small platelets of semiconductor element chips. The wafer that is produced by slicing the ingot is processed into a mirror surface wafer with a mirror-polished surface and edge through the steps of lapping, etching, and further polishing. After that, in a device-manufacturing step, fine electronic circuits are formed on the surface of the mirror-polished wafer.

Accompanied by development of highly integrated and high-performance LSIs, wiring technology has been shifting to new wiring structure and high integration. As the wiring becomes multilayer, an interlayer insulation film between wirings becomes also multiple layers, thereby the resulting wafer has uneven surface. Further, the uneven surface causes reduction of accuracy in processing the interlayer insulation film and wiring formed thereon, which brings about reduced reliability on LSI as well. Therefore, during a step of forming a device, a chemical mechanical polishing method (called CMP) is frequently used for planarizing a wiring metal and an interlayer insulation film in LSI production process. On the other hand, from the viewpoint of developing high-speed LSIs, the process for forming the electronic circuits has been shifting from a conventional wiring material of Al and W, to Cu having still lower electrical resistance. And a low-k film (such as a SiOC film or the like) having lower dielectric constant than a silicon oxide film ($SiO_2$ film) is used as an interlayer insulation film.

As for a polishing method, the following method is commonly used: a work piece is put on a surface having a polishing cloth formed of, for example, a synthetic porous resin sheet, a suede-like synthetic leather, or the like; and the work piece is rotated while a polishing composition solution called a slurry is supplied at a fixed flow, under a state of pressing the work piece against the surface. The types of abrasive grains and chemical solutions for the slurry are selected depending on the material of the work piece. As an abrasive grain, cerium oxide, zirconium oxide, alumina, or silica is used. Of those, silica is frequently used for final polishing to attain an excellent mirror-surface.

As a dispersion solution for silica abrasive grains, a dispersion solution of fumed silica, colloidal silica, and the like are exemplified. The specification of the present invention refers to all the dispersion solutions as "silica slurry".

Many technologies for planarizing a metal film and an interlayer insulation film have been developed. When those technologies are applied to planarization of a wiring metal which is finely-structured and multilayered by formation of a metal connection (plug) between the upper and lower of multilayered wirings, formation of buried wirings and the like, scratches and dishing occur in the case of broad wiring, and erosion and the like occur in the case of fine wiring. As those occurrences damage planarization, there is a concern that connection between wirings may become bad.

Of those, since a polishing method using acidic slurry can allow high polishing rate, the method can make the selectivity of a $SiO_2$ film and a SiOC film larger. However, when acidic silica slurry is used, scratches by abrasive grains are generated. The reason for the generation of scratches can be explained as follows.

Almost all silica abrasive grain particles containing a very small amount of impurities such as aluminum oxide and the like have an isoelectric point of surface electric charge of around pH 2 to 4. The silica abrasive grain particles are negatively charged in the alkaline range and exhibit stable dispersibility, but the particles are weakly charged in the acidic range or the neutral range having a pH of 3 to 7. Therefore, dispersion stability is not maintained, thereby resulting in aggregation and gelation of the particles.

Due to the above reason, a commercially available silica slurry is adjusted to alkaline range by an alkaline component. Therefore, it is known that when the pH of the silica slurry is adjusted to acidity by adding an acid and used in the acidic range, dispersion becomes unstable, and occur aggregation or precipitation. As a result, when polishing is performed using a silica slurry containing the aggregated silica particles, scratches are generated on the wiring metal and interlayer insulation film.

On the contrary, as a method of improving dispersibility under acidic conditions, JP 2001-332518 A discloses a method of changing the surface property of silica particles by using Al. However, although the method improves dispersibility of the silica particles, the method contributes to inclusion of metals other than silicone. Metals which require caution include Al, Fe, and Cu. In particular, Al is not easily removed by cleaning, so it is considered that Al inclusion leads to a high probability of wafer contamination.

WO 89/12082 describes a polishing composition for a silicon wafer including a modified trialkylsilylation. The modified colloidal silica sol has the following effects: alkyl groups prevent the condensation reaction of a silanol group, thereby preventing silica particles from bonding to each other; generation of hard and large gel particles is suppressed; and a source of generating scratches is eliminated. Although the modified colloidal silica sol has the same object as the present invention, this silica remains to be negatively charged, because trialkylsilylation does not cause change of electric charge. Therefore, this silica can be used for polishing in an alkaline condition, but have a problem in an acidic condition.

In addition, JP 08-45934 A discloses a polishing method using silica particles whose surface property is modified by using an organic silicone compound having amino group in order to solve the above-mentioned problems. JP 08-45934 A describes that, in the method, stability of a particle dispersion is enhanced in the acidic range by negatively charging surface electric potential of the silica particles owing to surface treatment. That is, as the surface treatment reaction is carried out at a high temperature such as 145° C. in an organic solvent such as ortho-xylene or the like, the reaction will probably be different from the reaction in the present invention. For example, the reaction in the present invention is a dehydration condensation reaction of a methoxy group of γ-aminopropyltrimethoxysilane with a silanol group on the surface of silica in the presence of an acidic catalyst. Further, the method of JP08-45934A requires a reaction apparatus, a collection apparatus, and the like to collect an organic solvent, which leads not only to a production cost increase, but also to inefficient large-scale production.

JP 2003-243340 A describes a polishing slurry for a silicon wafer including silica as a abrasive grain, and organosilane containing an amino group or a partial hydrolysis condensation product thereof. JP 2003-243340 A describes that colloidal silica having a pH of 8 to 12.5 with addition of γ-aminopropyltrimethoxysilane is preferably used for polishing. In the method, γ-aminopropyltrimethoxysilane is used as an alkaline agent for the same purpose as aminoalcohol, so the surface of silica is not modified due to alkaline property thereof. Therefore, the colloidal silica of JP 2003-243340 A is different from the positively-charged colloidal silica of the present invention.

JP 2006-196508 A describes silica particles having a zeta potential of 5 mV or more measured by an electrophoresis method, an oxidant, a protective film forming agent with respect to a metal surface, and a CMP polishing solution for a semiconductor metal film containing an acid and water. The examples of JP 2006-196508 A describes use of tetraethoxysilane hydrolyzed with ammonia, benzotriazole, a silane coupling agent, and salicylic acid as an acid. The kinds of silane coupling agent are not described, and an acid is described as an etching agent for copper wiring. That is, hydrolyzation of the coupling agent is not described at all. In a condition of such a strong acid (low pKa value) as salicylic acid (pKa: 2.96), hydrolyzation of a silane coupling agent is performed at an excessively rapid rate, so salicylic acid is not suitable for modification of surface properties of silica particles. Accordingly, the electric charge value described in the examples is small.

Since a compound containing an amino group can contribute to both an effect as an alkaline agent and an effect as a chelating agent, many polishing methods using a compound containing an amino group have been proposed in documents other than JP 2003-243340 A (for example, JP 08-83780 A).

It is an object of the present invention to provide a polishing composition for a mirror-polishing process on a wiring metal, which can provide a high polishing rate in polishing a finely-structured and multilayered wiring without causing flaws called scratches on the wiring metal and an interlayer insulation film, and can provide a favorable surface roughness, and a method of producing the polishing composition. Another object of the present invention is to provide a method of producing the polishing composition in which the polishing composition is synthesized without being subjected to a high temperature heat treatment. Still another object of the present invention is to provide a polishing method for a semiconductor wafer that uses the above-mentioned polishing composition.

SUMMARY OF THE INVENTION

As a result of intensive study, the inventors of the present invention found that a polishing composition for a semiconductor wafer comprising positively-charged silica particles obtained by modifying surface properties of the silica particles with an amino group-containing silane coupling agent in an acidic aqueous medium has solved the above problems, to complete the invention. That is, a first aspect of the present invention provides a polishing composition for a semiconductor wafer comprising: an acid; and an aqueous medium dispersion containing positively-charged silica particles having a surface on which an amino group-containing silane coupling agent is bonded, the polishing composition having a pH of 2 to 6. The amino group-containing silica coupling agent is preferably γ-aminopropyltrialkoxysilane. The acid is preferably an organic acid having a pKa that is a logarithm of a reciprocal of an acid dissociation constant of 3 to 5 at 25° C. The organic acid is preferably acetic acid or malic acid.

Further, in the present invention, the amount of the amino group-containing silane coupling agent is preferably in the range of 0.005 to 0.015 mmol/m$^2$ with respect to the total surface area of the silica particles before coupling treatment. In addition, silica particles preferably have a specific surface area of 30 to 270 m$^2$/g measured by a nitrogen adsorption BET method before coupling treatment.

In addition, a second aspect of the present invention provides a method of producing a polishing composition for a semiconductor wafer, comprising binding an amino group-containing silane coupling agent on a surface of silica particles in an acidic water dispersion medium having a pH adjusted to 1.5 to 4.0 to produce an aqueous medium dispersion containing positively-charged silica particles.

A third aspect of the present invention provides a polishing method using the above polishing composition to polish a surface or edge of a semiconductor wafer.

The positively-charged silica particles used in the present invention have a high dispersion property even in an acidic aqueous medium, and particle aggregation with time does not occur. Use of the polishing composition according to the present invention enables a polishing process to be performed on a wiring metal, which can attain a high polishing rate in polishing a finely-structured and multilayered wiring, which generates no scratches on the wiring metal and an interlayer insulation film, and can attain a favorable surface roughness. As the present invention prevents flaws called scratches that are generated by aggregated particles, miniaturized processing of the wiring become possible, which will have a very large effect in the related industry.

DETAILED DESCRIPTION OF THE PREFERRED EMBODIMENTS

The present invention will be further described below.

(Silica Particles)

Any production method for silica particles used in the present invention can be adopted as long as the silica particles have a specific surface area of 30 to 270 m$^2$/g measured by a BET method. A specific surface area measured by a BET method is obtained by measuring powdered silica particles using a nitrogen adsorption BET method. Examples of the production method for the silica particles include such methods as the so-called vapor phase method and liquid phase method, both of which can be used. For example, in the case of the vapor phase method, a powder called fumed silica which is prepared by reacting silicon tetrachloride at 1,000° C. or more in the presence of oxygen and hydrogen is commercially available from NIPPON AEROSIL CO., LTD. The production method of the present invention can convert the powder dispersed in water to silica slurry containing positively-charged silica particles. Moreover, as water dispersion slurry stabilized by compounding an alkaline agent is commercially available, the water dispersion slurry can also be used. On the other hand, in the case of the liquid phase method, silica slurry is commercially available, the silica slurry being obtained by an alkoxide method in which an organic silicon compound like tetraethoxysilane is hydrolyzed to synthesize the silica slurry. A water dispersion solution containing silica particles prepared by a water glass method using sodium silicate as a starting material is commonly called colloidal silica or a silica sol, which is commercially available from Nippon Chemical Industrial Co., Ltd. or the like. Any silica slurry can be used, but of those, silica particles synthesized by the water glass method are preferably used, because these silica particles are less expensive.

Many of the commercially available colloidal silica products prepared by the water glass method are negatively-charged silica particles, and usually contain an alkali metal and have an alkaline property. Although the colloidal silica may be used as it is, in order to prevent the aggregation of silica particles, it is more preferred to use colloidal silicas prepared by contact with a cation exchange resin to remove an alkali metal on the surfaces of the particles and in an aqueous phase. Note that a method of bringing the silica particles into contact with the cation exchange resin can be performed by a batch method or a column method, and the column method is preferable. Although colloidal silica products are already commercially available, the products being prepared by removing an alkaline component from the alkaline colloidal silica through cation exchange, many of the products are modified by aluminum oxide to have large surface negative charges. In that case, aluminum oxide may be released as metal ions into a liquid phase, thereby causing contamination of a wafer, so those products are not preferable as materials.

Further, colloidal silica formed of positively-charged silica particles is also commercially available, but the colloidal silica is also not preferable, because the silica particles have been subjected to surface treatment with aluminum oxide.

Silica particles of any shape such as spherical, cocoon, and string shapes may be used. Alternatively, two kinds of silica particles each having a clearly distinguishable specific surface area range may be used in combination. One kind of silica particles may have, for example, a specific surface area of 50 m$^2$/g, and the other kind of silica particles may have, for example, a specific surface area of 100 m$^2$/g. Several kinds of silica particles each having a different specific surface area may be arbitrarily mixed with each other as required. Such silica particles having a different specific surface area may be mixed with each other after they are converted to positively-charged silica particles by the production method of the present invention. Alternatively, such silica particles each having a different specific surface area may be converted to positively-charged silica particles by the production method of the present invention after they are mixed with each other.

(Amino Group-Containing Silane Coupling Agent)

Examples of silane coupling agents used for producing the positively-charged silica particles obtained by surface-treating the silica particles of the present invention include N-β(aminoethyl) γ-aminopropyltrimethoxysilane, N-β(aminoethyl) γ-aminopropylmethyldimethoxysilane, γ-aminopropyltriethoxysilane, and N-phenyl-γ-aminopropyltrimethoxysilane. Of those, γ-aminopropyltriethoxysilane containing a triethoxy group is preferable. Those amino group-containing silane coupling agents are desirably added in the range of 0.005 to 0.015 mmol/m$^2$ based on total surface area of silica particles present in a solution. An addition of the amino group-containing silane coupling agents in a smaller amount than the above amount is not preferable, because a sufficient amount of positively-charged silica particles or silica particles having highly positive charge may not be provided. As a result, stability of the silica particles in an acidic solution diminishes. A positive charge value as a zeta potential is preferably larger than 20 mV, and more preferably larger than 30 mV. On the other hand, an addition of the amino group-containing silane coupling agents in a larger amount than the above amount is also not preferable, because the amino group-containing silane coupling agents which are not able to react with a surface of the silica particles are reacted to each other. A condensation product obtained by polymerization of 2 or more monomers, which is a reaction product, is an impure substance as a polishing composition, and causes organic substance contamination on a surface of a semiconductor.

(Acid)

In the present invention, treatment of silica particles with an amino group-containing silane coupling agent is performed in the presence of an acid. A dispersion solution of silica particles containing an acid preferably has a pH of 1.5 to 4.0. The amino group-containing silane coupling agent dissolved in water has an alkaline property due to a positively-charged amino group, thereby neutralizing the acid. Therefore, as described below, use of an acid having a pKa value in the range of 3 to 5 results in a dispersion solution of silica particles having a pH of 2 to 6 during and after hydrolysis by the coupling agent.

The acid acts as a catalyst for coupling treatment, and promotes hydrolysis of an alkoxy group by the coupling agent. As a result, dehydration condensation with a silanol group on the surfaces of the silica particles is securely performed, and reaction time at room temperature can be shortened. Because the method of using an acid and the like is described in the brochures of silane coupling agents or many documents in detail, the details thereof are omitted here. On the other hand, the acid remaining in the solution after completing its role as a catalyst acts as an etching agent that improves a chemical polishing ability for a wafer. Therefore, it is necessary to consider a polishing ability in selecting kinds of acids. In a constitution of the polishing composition, an addition of acids other than the acid added as a catalyst for a coupling reaction is also preferable in order to improve the chemical polishing ability of the polishing composition.

In addition, it is required that an aqueous medium dispersion formed of positively-charged silica particles having the surfaces on which the amino group-containing silane coupling agent of the present invention is bonded, and the polishing composition containing positively-charged silica particles include an acid, and are adjusted to have acidic property of a pH of 2 to 6. The acidic property is preferably in the range of a pH of 3 to 5. When the pH is less than 2, wafer etching action is enhanced, but, on the contrary, surface roughness deteriorates and a processing apparatus is corroded, which is not preferable. When positively-charged silica slurry has a neutral or alkaline property, namely having a pH higher than 6, dispersion of silica particles become unstable, thereby resulting in aggregation of silica particles or generation of a gel.

As described above, it is necessary to keep the polishing composition acidic. When a polishing process causes a pH rise, it is important to secure dispersion stability of silica particles. Briefly, an addition of an acid in the range of 0.5 to 5 moles with respect to 1 kg of silica particles is desirable.

In order to obtain the above performance, an organic acid having a pKa value of 3 to 5 at 25° C. is preferable as an acidic catalyst for hydrolyzing a silane coupling agent. Examples of the organic acids include benzoic acid (pKa value: 4.21), formic acid (pKa value: 3.75), citric acid (pKa value: 3.13), succinic acid (pKa value: 4.21), acetic acid (pKa value: 4.76), tartaric acid (pKa value: 3.04), propionic acid (pKa value: 4.87), butyric acid (pKa value: 4.57), malic acid (pKa value: 3.23), lactic acid (pKa value: 3.64), fumaric acid (pKa value: 3.07), and adipic acid (pKa value: 4.41). Of those, acetic acid is preferable because of the following reasons. Acetic acid is easy to handle, because it is widely used as a coupling catalyst for a silane coupling agent, and its usage is disclosed. Further, time required for hydrolysis of a coupling agent can be adjusted between tens of minutes and several hours. Still further, acetic acid is available at a low price. On the other hand, odorless organic acids such as malic acid and citric acid are preferable from the viewpoint of treatment.

These acids are preferably compounded in such an amount as to enable a concentration of 0.1 to 1 mole/L with respect to the amount of an aqueous medium dispersion of positively-charged silica particles. Further, in the constitution of the polishing composition as well, those acids are preferably compounded in an amount enabling the range of the above concentration. When an acid having a pKa value of 3 to 5 is compounded at a concentration of 0.1 to 1 mole/L, the composition has a pH value close to the pKa value. Even if the composition is diluted 10-fold or mixed with about 0.1 mole of an alkaline, the composition shows what is called a buffering action, which means that the pH value of the composition barely changes, so addition of the acid having a pKa value of 3 to 5 at the concentration of 0.1 to 1 mole/L is preferable in order to obtain dispersion stability of the silica particles. On the other hand, an acid having a pKa value of more than 5 is not preferable, because the acid has an insufficient acidic catalyst ability, thereby making dispersion of silica particles unstable. An acid having a pKa value of less than 3 is not preferable, because the acid has a weak buffering action, thereby not only causing a large variation of a pH value, but also causing corrosion of a treatment apparatus and excessive corrosion of a wiring metal.

When the silane coupling agents perform hydrolysis, hydrolysis by the silane coupling agents is excessively and rapidly performed in an acid having a pKa value of less than 3. Therefore, the silane coupling agents are polymerized with each other in synchronization with the bonding to the surfaces of the silica particles, thereby resulting in insufficient modification of the surfaces of the silica particles. Coupling agents formed of dimers or trimers obtained as by-products serve as impure substances for the polishing composition. Thus, an acid having a pKa value of less than 3 is not appropriate.

Examples of acids having a pKa value of less than 3 include salicylic acid (pKa value: 2.96), oxalic acid (pKa value: 1.27), malonic acid (pKa value: 2.86), maleic acid (pKa value: 1.92), phthalic acid (pKa value: 2.75), glutamic acid (pKa value: 2.19), glycine (pKa value: 2.91), and ethylenediamine tetra acetic acid (pKa value: 2.0). These acids are not suitable for use as a hydrolysis catalyst for a silane coupling agent, but, may well be used as a polishing promoter forming the composition described below.

The polishing composition of the present invention is basically in the form of aqueous slurry formed of the above components, and water is usually used as a solvent. Alcohols can also be added as a solvent, if required. It is preferred that the polishing composition is produced at a silica particle concentration of 20 to 50 wt %, and that pure water or, if necessary, an additive described below is added so that silica particle concentration of the polishing composition is 2 to 50 wt % when using the polishing composition. It is more preferred that silica particle concentration is 10 to 25 wt % in order to further improve the polishing ability of the polishing composition.

In addition, the polishing composition of the present invention can be used in combination with various kinds of additives, if required. Those additives include polishing promoters, oxidants, anticorrosives, chelating compounds, surfactants, dispersants, antiprecipitation agents, and defoamers.

Other than the above-mentioned organic acids as a hydrolysis catalyst for a silane coupling agent, examples of the polishing promoters preferably include carboxylix acids such as salicylic acid, oxalic acid, malonic acid, maleic acid, and phthalic acid in an amount resulting in the above range of a pH of 2 to 6, and amino acids such as glutamic acid, glycine, glycylglycine, alanine, arginine, valine, asparaginic acid, aminobutyric acid, and aminocaproic acid. Further, ammonium salts of an inorganic acid such as ammonium phosphate, ammonium fluoride, and ammonium hexafluorosilicate, and inorganic acids such as hydrochloric acid, nitric acid, sulfuric acid, and hydrofluoric acid in the above pH range can be used as the polishing promoter.

As the oxidant, known acids such as periodic acid or hydrogen peroxide can be used. Further, inorganic peroxides such as hypochlorous acid, perchloric acid, nitric acid, ozone water can be used. And organic peroxides such as acetyl hyperoxide, and nitrobenzene can be used. Of those, hydrogen peroxides which do not contain a metal component and do not generate a harmful by-product are preferable. An addition amount of the oxidant is preferably 0.1 wt % or more to 10 wt % or less with respect to the total amount of the polishing composition. An addition of 0.1 wt % or less leads to a slow polishing rate, and an addition of 10 wt % or more does not cause any polishing promotion effect, because the polishing rate has already reached the highest point.

Examples of the corrosion inhibitors include benzotriazole, 1,2,4-triazole, benzofuroxan, 2,1,3-benzothiazole, o-phenylenediamine, m-phenylenediamine, catechol, o-aminophenol, 2-mercaptobenzothiazole, 2-mercaptobenzoimidazole, 2-mercaptobenzoxazole, melamine, and derivatives thereof. Of these, benzotriazole and its derivatives are preferable. Azoles such as benzotriazole form an insoluble chelating compound with copper, thereby exhibiting an anticorrosive action. Quinoline derivatives such as quinolinol and quinaldic acid are also known to have similar action to that of azoles, so use of quinoline derivatives is also preferable. An addition amount of the corrosion inhibitors is preferably 0.001 wt % or more to 5.0 wt % or less with respect to the total amount of the polishing composition. Use of the anticorrosives in the range can attain a suitable polishing rate and an inhibiting action.

As the chelating agents, ethylenediaminetetraacetate, nitrilotriacetate, phosphonic acid, and the like are preferably used. As a base serving as a counterion for the chelating agents, an organic base such as ammonium or tetramethylammonium is preferable. Examples of the bases further include one or two or more kinds selected from the group of diethylenetriamine pentaacetate, iminodiacetate, hydroxyethylimino diacetate, triethylenetetramine hexaacetate, 1,3-propanediamine tetraacetate, ethylene glycol diethyl ether diaminetetraacetate, and ammonium salts thereof, and the like. Each of those chelating agents is bonded to a metal in the polishing solution, especially to copper or nickel, by a coordinate bond, whereby the copper or nickel is stabilized in the polishing solution to suppress metal contamination on a wafer. Therefore, an amount of a metal contamination substance for a wafer can be effectively reduced.

As the dispersants or the antisettling agents, soluble polymers such as polyacrylic acid, hydroxyethylcellulose, polyethyleneimine, and polyvinyl alcohol can be preferably used. As the surfactants, a polyoxyalkylene alkyl ether triblock copolymer and the like are preferably used.

As the defoamers, a silicone emulsion defoamer and the like are preferably used. In addition to those, an acid or a base for pH adjustment, additives such as a corrosion inhibitors and a disinfectant, or water may be mixed to prepare the polishing composition.

To the polishing composition of the present invention, other polishing agents such as colloidal zirconia and fumed alumina may be added when polishing is performed.

As a method of producing slurry in the present invention when fumed silica is used as abrasive grains, any commonly known production method can be applied. That is, an appropriate amount of fumed silica is mixed in water, and aggregated silica particles are converted to the state of primary particles by dispersion of the particles. Specifically, ultrasonic dispersion machines, various kinds of bead mills dispersion machines, homogenizers, kneaders, ball mills, or the like are used to perform particle dispersion by high shear force. It is preferred that an acid and an amino group-containing silane coupling agent be added to the water in advance. It is further preferred that only the acid be added to water in advance, and the amino group-containing silane coupling agent be added after the dispersion of the fumed silica.

Next, a polishing processing method using the polishing composition of the present invention will be described.

A surface polishing method comprises: rotating a rotatable polishing plate and/or a semiconductor wafer while the polishing composition according to the present invention is supplied to the polishing plate to polish a surface of the semiconductor wafer by using the polishing plate having a polishing cloth fixed to both or either of its upper and lower face, under a state of pressing the semiconductor wafer against the polishing plate.

Typically, an edge polishing method comprises: pressing a semiconductor wafer to a drum-shaped polishing member having a polishing cloth fixed to its surface or a polishing machine having a polishing member with a circular working surface; and rotating the polishing member and/or the semiconductor wafer while supplying the polishing composition according to the present invention to polish an edge of the semiconductor wafer.

EXAMPLE

Next, the present invention will be described in more detail in the examples, but the present invention is not limited to these examples. It should be noted that % represents wt %.

Example 1

<Preparation of Acidic Colloidal Silica A0>

Commercially available colloidal silica having a silica concentration of 40% (trade name: SILICADOL manufactured by Nippon Chemical Industrial Co., Ltd.) was used. The colloidal silica had a specific surface area of 68 m$^2$/g, which was converted to a particle diameter of 40 nm. The colloidal silica contained 0.37% of Na$_2$O component (0.27% of Na after conversion to Na), and had a pH of 9.9. The specific surface area was measured by using FLOW SORB 2300 manufactured by Shimadzu Corporation. A commercially available cation exchange resin having strong acidity (AMBERLITE IR120B manufactured by ORGANO CORPORATION) was used as a cation exchange resin. A column was filled with the cation exchange resins, and adjusted to a proton type with 5% hydrochloride acid.

To 150 kg (about 115 L) of colloidal silica having a specific surface area of 68 m$^2$/g, 250 kg of pure water was added to prepare 400 kg (about 360 L) of diluted colloidal silica having a silica concentration of 15%. The diluted colloidal silica was passed through the column filled with 25 L of the cation exchange resins to obtain about 500 L of acidic colloidal silica having a pH of 2.9. The acidic colloidal silica was filtered off under pressure using a hollow fiber ultrafiltration membrane having a fractionation molecular weight of 10,000 (MICROZA UF module SIP-3053 manufactured by Asahi Kasei Corporation) while the acidic colloidal silica was circulated with a liquid circulation pump. In this way, the acidic colloidal silica was concentrated to 40% of silica concentration to obtain 128 kg of acidic colloidal silica. The obtained colloidal silica is referred to as Colloidal Silica A0.

<Preparation of Positively-Charged Colloidal Silica A1>

Next, 8 kg of 99% acetic acid for industrial use was added to 92 kg of ion-exchanged water, and the mixture was mixed uniformly. To the mixture, 100 kg of the acidic Colloidal Silica A0 was added, and the resultant was mixed uniformly while being stirred. In this case, the mixture had a pH of 2.31, and silica particles had a total surface area of 2,720,000 m$^2$. Subsequently, 4 kg of γ-aminopropyltriethoxysilane (KBE903 manufactured by Shin-Etsu Chemical Co., Ltd.) was added. In this case, an amino group-containing silane coupling agent was adjusted to 0.0066mmol/m$^2$ based on a surface area of the silica particles. The resultant mixture was continually stirred for 16 hours to complete the reaction of the coupling agent, whereby acidic colloidal silica containing positively-charged silica particles was obtained, the acidic colloidal silica having a silica concentration of about 20% and a pH of 3.9. The obtained colloidal silica is referred to as Colloidal Silica A1.

Charge measurement of the silica particles was performed by using a zeta potential meter by an electrophoresis light scattering method, DELSA440SX manufactured by Coulter, Inc. The measurement was performed using Colloidal Silica A1 diluted 20-fold with pure water, and the measurement conditions were set to a current of 0.296 mA, pulse ON of 2.5 s, pulse OFF of 0.5 s, and a temperature of 25° C. In this case, the zeta potential was 48.4 mV, and it was confirmed that the silica particles were positively charged. When the zeta potential was measured, the pH of the diluted 20-fold solution was simultaneously measured. The solution had a pH of 3.79, which confirmed that the change of pH of the undiluted solution from a pH of 3.90 was very small.

The charge of the silica particles was confirmed by another measurement apparatus. The measurement was performed by an electrophoresis light scattering method, using Zetasizer Nano-ZS type zeta potential meter manufactured by Malvern Instruments Ltd. (available from SYSMEX CORPORATION). The measurement was performed at 25° C. using Colloidal Silica A1 diluted 20-fold with pure water. In this case, the zeta potential was 50.5 mV, and it was confirmed that the silica particles were positively charged.

<Production of Polishing Composition A2>

20 kg of the Colloidal Silica A1 containing positively-charged silica particles, the Colloidal Silica A1 having a silica concentration of about 20% and a pH of 3.9, were diluted 5-fold with pure water. To the diluted solution, 4.0 kg of 30% hydrogen peroxide water were added and the mixture was stirred uniformly, whereby Polishing Composition A2 was produced. The following polishing test was performed. The results are shown in Table 1.

<Polishing Test of Polishing Composition A2>

The following polishing test was performed using the Polishing Composition A2. The results are shown in Table 1. The polishing test was carried out using a wafer for evaluation, on which a W wiring was formed. The polishing test was carried out by: rotating a polishing plate referred to as a plate to which a polishing cloth was attached; and rotating a wafer holder to which a wafer for evaluation was fixed while the polishing Compound A2 was dropped thereon, under a state of pressing the wafer holder against the polishing plate.

Plate rotating speed: 40 rpm
Wafer holder rotating speed: 20 rpm
Polishing pressure: 5.5×1,000 Pa
Slurry supply: 300 ml/minute After completion of the polishing, the wafer was washed with water to remove the polishing composition, and was evaluated. The time period was measured from the polishing starting time to the time when the wiring metal was flattened by polishing to a predetermined thickness. The surface of the wafer was evaluated by visual observation using a condenser lamp, and the number of flaws per $cm^2$ was counted.

Example 2

<Preparation of Acidic Colloidal Silica B0>

Commercially available colloidal silica with a silica concentration of 30% (trade name: SILICADOL manufactured by Nippon Chemical Industrial Co., Ltd.) was used. The colloidal silica had a specific surface area of 54 $m^2$/g, which was converted to a particle diameter of 50 nm. The colloidal silica contained 0.31% of $Na_2O$ component (0.23% of Na after conversion to Na), and had a pH of 10.0. The specific surface area was measured by using FLOW SORB 2300 manufactured by Shimadzu Corporation. A commercially available cation exchange resin having strong acidity (AMBERLITE IR120B manufactured by ORGANO CORPORATION.) was used as a cation exchange resin. A column was filled with the cation exchange resins and adjusted to a proton type with 5% hydrochloride acid.

To 150 kg (about 125 L) of colloidal silica having a specific surface area of 54 $m^2$/g, 150 kg of pure water was added to prepare 300 kg (about 270 L) of diluted colloidal silica having a silica concentration of 15%. The diluted colloidal silica was passed through the column filled with 25 L of the cation exchange resins to obtain about 400 L of the acidic colloidal silica having a pH of 2.9. The acidic colloidal silica was filtered off under pressure using a hollow fiber ultrafiltration membrane having a fractionation molecular weight of 10,000 (MICROZA UF module SIP-3053 manufactured by Asahi Kasei Corporation) while the acidic colloidal silica was circulated with a liquid circulation pump. In this way, the acidic colloidal silica was concentrated to 30% of silica concentration to obtain 135 kg of acidic colloidal silica. The obtained colloidal silica is referred to as Colloidal Silica B0.

<Preparation of Positively-Charged Colloidal Silica B1>

Next, 4 kg of 99% DL-malic acid for industrial use was added to 96 kg of ion-exchanged water, and the mixture was mixed uniformly. To the mixture, 100 kg of the acidic Colloidal Silica B0 was added, and the resultant was mixed uniformly while being stirred. In this case, the mixture had a pH of 2.03, and silica particles had a total surface area of 1,620,000 $m^2$. Subsequently, 4 kg of γ-aminopropyltriethoxysilane (KBE903 manufactured by Shin-Etsu Chemical Co., Ltd.) was added. In this case, an amino group-containing silane coupling agent was adjusted to 0.0112 mmol/$m^2$ based on a surface area of the silica particles. Subsequently, the resultant mixture was heated to 35° C. while being stirred, followed by being stirred for 6 hours. The mixture was then left to stand for cooling to complete the reaction of the coupling agent, whereby acidic colloidal silica containing positively-charged silica particles was obtained, the acidic colloidal silica having a silica concentration of about 15% and a pH of 3.38. The obtained colloidal silica is referred to as Colloidal Silica B1.

The charge of the silica particles was confirmed by an electrophoresis light scattering method, using Zetasizer Nano-ZS type zeta potential meter manufactured by Malvern Instruments Ltd. (available from SYSMEX CORPORATION). The measurement was performed at 25° C. using Colloidal Silica B1 diluted 20-fold with pure water. In this case, the zeta potential was 38.1 mV, and it was confirmed that the silica particles were positively charged. When the zeta potential was measured, the pH of the diluted 20-fold solution was simultaneously measured. The solution had a pH of 3.57, which confirmed that the change of the pH of the undiluted solution from a pH of 3.38 was very small.

<Production of Polishing Composition B2>

20 kg of the Colloidal Silica B1 containing positively-charged silica particles, the Colloidal Silica B1 having a silica concentration of about 15% and a pH of 3.38, were diluted 3.75-fold with pure water. 4.0 kg of 30% hydrogen peroxide water, 0.1 kg of ethanol, and 0.05 kg of benzotriazole were added to the diluted solution, and the mixture was stirred uniformly, whereby Polishing Composition B2 was produced. The following polishing test was performed. The results are shown in Table 1.

<Polishing Test of Polishing Composition B2>

The following polishing test was performed using the Polishing Composition B2. The results are shown in Table 1. The polishing test was carried out using a wafer for evaluation, on which a W wiring was formed. The polishing conditions were set to the same conditions as in Example 1 except that Polishing Composition B2 was used.

Example 3

<Preparation of Acidic Colloidal Silica C0>

Commercially available colloidal silica with a silica concentration of 30% (trade name: SILICADOL manufactured by Nippon Chemical Industrial Co., Ltd.) was used. The colloidal silica had a specific surface area of 50.7 $m^2$/g, which was converted to a particle diameter of 53.6 nm. The colloidal silica contained 0.31% of $Na_2O$ component (0.23% of Na after conversion to Na), and had a pH of 10.0. The specific surface area was measured by using FLOW SORB 2300 manufactured by Shimadzu Corporation. A commercially available cation exchange resin having strong acidity (AMBERLITE IR120B manufactured by ORGANO CORPORATION) was used as a cation exchange resin. A column was filled with the cation exchange resins and adjusted to a proton type with 5% hydrochloride acid.

To 150 kg (about 125 L) of colloidal silica having a specific surface area of 50.7 $m^2$/g, 150 kg of pure water was added to prepare 300 kg (about 270 L) of diluted colloidal silica having a silica concentration of 15%. The diluted colloidal silica was passed through the column filled with 25 L of the cation exchange resins to obtain about 400 L of the acidic colloidal silica having a pH of 2.9. The acidic colloidal silica was filtered off under pressure using a hollow fiber ultrafiltration membrane having a fractionation molecular weight of 10,000 (MICROZA UF module SIP-3053 manufactured by Asahi Kasei Corporation) while the acidic colloidal silica was circulated with a liquid circulation pump. In this way, the acidic colloidal silica was concentrated to 30% of silica concentration to obtain 135 kg of acidic colloidal silica. The obtained colloidal silica is referred to as Colloidal Silica C0.

<Preparation of Positively-Charged Colloidal Silica C1>

Next, 7 kg of a reagent formed of 99.5% citric acid monohydrate was added to 43 kg of ion-exchanged water, and the mixture was mixed uniformly. To the mixture, 100 kg of the acidic Colloidal Silica C0 was added, and the resultant was mixed uniformly while being stirred. In this case, the mixture had a pH of 1.78, and silica particles had a total surface area of 1,521,000 $m^2$. Subsequently, 2.235 kg of γ-aminopropyltriethoxysilane (KBE903 manufactured by Shin-Etsu Chemical Co., Ltd.) was added. In this case, an amino group-containing silane coupling agent was adjusted to 0.00664 mmol/$m^2$ based on a surface area of the silica particles. Subsequently, the resultant mixture was temporarily heated to 35° C. while being stirred, followed by being stirred for 6 hours. The mixture was then left to stand for cooling to complete the reaction of the coupling agent, whereby acidic colloidal silica containing positively-charged silica particles was obtained, the acidic colloidal silica having a silica concentration of about 20% and a pH of 2.48. The obtained colloidal silica is referred to as Colloidal Silica C1.

The charge of the silica particles was confirmed by another measurement apparatus. The measurement was performed by an electrophoresis light scattering method, using Zetasizer Nano-ZS type zeta potential meter manufactured by Malvern Instruments Ltd. (available from SYSMEX CORPORATION). The measurement was performed at 25° C. using Colloidal Silica C1 diluted 20-fold with pure water. In this case, the zeta potential was 44.8 mV, and it was confirmed that the silica particles were positively charged. When the zeta potential was measured, the pH of the diluted 20-fold solution was simultaneously measured. The solution had a pH of 2.86, which confirmed that the change of the pH of the undiluted solution from a pH of 2.48 was very small.

<Production of Polishing Composition C2>

20 kg of the Colloidal Silica C1 containing positively-charged silica particles, the Colloidal Silica C1 having a silica concentration of about 20% and a pH of 2.48, were diluted 5-fold with pure water. To the diluted solution, 6.7 kg of 30% hydrogen peroxide water, 0.1 kg of ethanol, and 0.05 kg of benzotriazole were added. The mixture was adjusted by dropping of 28% ammonium water to have a pH of 4, whereby Polishing Composition C2 was produced. The following polishing test was performed. The results are shown in Table 1.

<Polishing Test of Polishing Composition C2>

The following polishing test was performed using the Polishing Composition C2. The results are shown in Table 1. The polishing test was carried out using a wafer for evaluation, on which a Cu wiring was formed. The polishing conditions were set to the same conditions as in Example 1 except that Polishing Composition C2 was used.

Comparative Example 1

<Preparation of Positively-Charged Colloidal Silica Using Alkaline Colloidal Silica>

Commercially available colloidal silica having a silica concentration of 40% (trade name: SILICADOL, manufactured by Nippon Chemical Industrial Co., Ltd.) was used. The colloidal silica had a specific surface area of 68 $m^2/g$, which was converted to a particle diameter of 40 nm. The colloidal silica contained 0.37% of $Na_2O$ component (0.27% of Na after conversion to Na), and had a pH of 9.9. The alkaline colloidal silica was used as it is.

First, 1.5 kg of ion-exchanged water was placed in a 3 L beaker, and 1.5 kg of the alkaline colloidal silica was added. The mixture was mixed uniformly while being stirred. Subsequently, 0.06 kg of γ-aminopropyltriethoxysilane (KBE903 manufactured by Shin-Etsu Chemical Co., Ltd.) was added.

The resultant mixture was continually stirred for 1 hour. As a result, a gel-like solid started to adhere to the inner surface of the beaker at the liquid surface. After continuous stirring for 16 hours, silica slurry having viscosity in the whole liquid was obtained. As the obtained substance was not in the form of a colloid, the substance is described as silica slurry instead of colloidal silica. The slurry had a pH of 11.4.

Part of the slurry was diluted 20-fold in order to measure charge of silica particles. As the slurry was formed of gel particles having precipitation properties, the diluted slurry could not be used for measurement.

In addition, the whole slurry lost fluidity, and solidified after being left to stand for 3 hours.

As described above, hydrolysis of a silane coupling agent is performed rapidly in an alkaline state, so the silane coupling agent is not selectively bonded to the surface of the colloidal particles. Therefore, polymerization between molecules of silane coupling agents progresses at random, so the target positively-charged colloidal silica cannot be obtained.

Comparative Example 2

The same colloidal silica (alkaline property, particle diameter of 40 nm) as in Example 1 was used with alkaline property as is without being subjected to cation exchange. First, the colloidal silica was diluted with pure water to the level of a silica concentration of about 20%. To the diluted solution 99% acetic acid was added, whereby acidic colloidal silica having a pH of 3.9 and a silica concentration of about 20% was obtained. The obtained solution was diluted 20-fold, and Charge measurement of the silica particles was performed by using a zeta potential meter by an electrophoresis light scattering method, DELSA440SX manufactured by Coulter, Inc. The zeta potential was −20 mV, and it was confirmed that the diluted solution was negatively charged.

20 kg of the acidic colloidal silica having a pH of 3.9 and a silica concentration of 20% obtained by an addition of acetic acid was diluted 5-fold with pure water. To the diluted solution, 6.7 kg of 30% hydrogen peroxide water was added and the resultant was mixed uniformly to produce a polishing composition. The same polishing test as in Example 1 was performed. The results are shown in Table 1.

Comparative Example 3

The same colloidal silica (alkaline property, particle diameter of 40 nm) as in Example 1 was passed through cation exchange resins to convert into acidic colloidal silica having a pH of 3.0. The acidic colloidal silica was concentrated by ultrafiltration to the level of a silica concentration of 40%. The acidic colloidal silica was diluted with pure water to the level of a concentration of about 20%. Tetramethylammonium hydroxide was added to the diluted acidic colloidal silica to adjust the pH thereof to 3.9. The obtained solution was diluted 20-fold, and Charge measurement of the silica particles was performed by using a zeta potential meter by an electrophoresis light scattering method, DELSA440SX manufactured by Coulter, Inc. The zeta potential was −22 mV, and it was confirmed that the diluted solution was negatively charged.

20 kg of the acidic colloidal silica having a pH of 3.9 and a silica concentration of 20% obtained by an addition of tetramethylammonium hydroxide were diluted 5-fold with pure water. To the diluted solution, 6.7 kg of 30% hydrogen peroxide water were added and the resultant was mixed uniformly to produce a polishing composition. The same polishing test as in Example 1 was performed. The results are shown in Table 1.

Comparative Example 4

<Preparation of Positively-Charged Colloidal Silica Using Inorganic Acid as Catalyst, No.1>

Commercially available colloidal silica with a silica concentration of 40% (trade name: SILICADOL manufactured by Nippon Chemical Industrial Co., Ltd.) was subjected to a γ-aminopropytriethoxysilane treatment using an inorganic acid as a catalyst. The colloidal silica had a particle diameter of 40 nm and a pH of 9.9.

To 150 kg (about 115 L) of the above alkaline colloidal silica, 250 kg of pure water was added to prepare 400 kg (about 360 L) of diluted colloidal silica having a silica concentration of 15%. The diluted colloidal silica was passed through a column filled with 25 L of the cation exchange resins, the column being adjusted to a proton type in advance, whereby about 500 L of the acidic colloidal silica having a pH of 2.9 was obtained. The acidic colloidal silica was filtered off under pressure using a hollow fiber ultrafiltration membrane having a fractionation molecular weight of 10,000 (MICROZA UF module SIP-3053 manufactured by Asahi Kasei Corporation) while the acidic colloidal silica was circulated with a liquid circulation pump. In this way, the acidic colloidal silica was concentrated to 40% of silica concentration to obtain 128 kg of acidic colloidal silica.

1.5 kg of ion-exchanged water was placed in a 3 L beaker, and 0.1 kg (similar mole amount to that of acetic acid in Example 1) of 35% hydrochloric acid was added into the beaker. After the mixture was mixed uniformly, 1.5 kg of the acidic colloidal silica was added. The resultant was mixed uniformly while being stirred. In this case, the colloidal silica had a pH of 0.81. Subsequently, 0.06 kg of γ-aminopropyltriethoxysilane (KBE903 manufactured by Shin-Etsu Chemical Co., Ltd.) was added, and the resultant was mixed uniformly. In this case, the colloidal silica had a pH of 0.88. When hydrochloric acid was used, the pH of the colloidal silica became too low to attain the target pH of 2 to 6. In this case, the zeta potential was 50.0 mV, and it was confirmed that the silica particles were positively charged. When the zeta potential was measured, the pH of the diluted 20-fold solution was simultaneously measured. The solution had a pH of 2.20, which confirmed that the change of the pH of the undiluted solution from a pH of 0.88 was very large.

After the diluted solution was continuously stirred for 24 hours, white turbidity was generated in the solution, which confirmed that the colloidal silica was aggregated.

Comparative Example 5

<Preparation of Positively-Charged Colloidal Silica Using Inorganic Acid as Catalyst, No.2>

The same γ-aminopropytriethoxysilane treatment as in Comparative Example 4 was tried except that a different amount of hydrochloric acid was used.

1.5 kg of ion-exchanged water was placed in a 3 L beaker, and 0.015 kg of 35% hydrochloric acid was added into the beaker. After the mixture was mixed uniformly, 1.5 kg of the acidic colloidal silica was added. The resultant was mixed uniformly while being stirred. In this case, the colloidal silica had a pH of 1.59. Subsequently, an addition of 0.06 kg of γ-aminopropyltriethoxysilane (KBE903 manufactured by Shin-Etsu Chemical Co., Ltd.) was started. However, in synchronization with the addition, a gel was generated. At the time of the addition of 0.03 kg, the colloidal silica was changed to slurry with no fluidity. In this case, the colloidal silica had a pH of 3.66. When the addition amount of hydrochloric acid was reduced, the target pH of 2 to 6 was attained, but silica was turned into a gel, whereby colloid was not obtained.

TABLE 1

|  | Example 1 | Example 2 | Example 3 | Comparative Example 2 | Comparative Example 3 |
|---|---|---|---|---|---|
| Number of scratches (number/cm$^2$) | none | none | none | 12 | 10 |
| Polishing rate (sec) | 32 | 40 | 81 | 62 | 48 |

As is evident from the results shown in the examples of Table 1, use of the polishing composition according to the present invention leads to performance of a mirror-polishing processing on a wiring metal, where a high polishing rate in polishing a finely-structured and multilayered wiring can be attain, no flaws called scratchs are generated on the wiring metal or the interlayer insulation film, and a favorable surface roughness can be attain. The present invention contributed to preventing scratches from being generated by aggregated particles, thereby enabling a miniaturized processing of the wiring, which has an extremely large effect in the related industry.

What is claimed is:

1. A polishing composition for a semiconductor wafer comprising:
   an acid; and
   an aqueous medium dispersion containing positively-charged silica particles having a surface on which an amino group-containing silane coupling agent is bonded,
   the polishing composition having a pH of 2 to 5,
   wherein the silica particles before coupling treatment have a specific surface area of 30 to 270 m$^2$/g measured by a nitrogen adsorption BET method.

2. A polishing composition for a semiconductor wafer according to claim 1, wherein the amino group-containing silane coupling agent is γ-aminopropyltrialkoxysilane.

3. A polishing composition for a semiconductor wafer according to claim 1, wherein the acid is an organic acid having a pKa that is a logarithm of a reciprocal of acid dissociation constant of 3 to 5 at 25° C.

4. A polishing composition for a semiconductor wafer according to claim 3, wherein the organic acid is acetic acid or malic acid.

5. A polishing composition for a semiconductor wafer according to claim 1, wherein an amount of the amino group-containing silane coupling agent is in the range of 0.005 to 0.015 mmol/m$^2$ based on total surface area of the silica particles before coupling treatment.

6. A method of producing a polishing composition for a semiconductor wafer, comprising binding an amino group-containing silane coupling agent on a surface of silica particles in an acidic water dispersion medium having a pH adjusted to 2 to 4.0 to produce an aqueous medium dispersion containing positively-charged silica particles, wherein the silica particles before coupling treatment have a specific surface area of 30 to 270 m$^2$/g measured by a nitrogen adsorption BET method.

7. A polishing method comprising:
   utilizing the polishing composition according to claim 1 to polish a surface or edge of a semiconductor wafer.

* * * * *